(12) United States Patent
Huang et al.

(10) Patent No.: US 11,948,954 B1
(45) Date of Patent: Apr. 2, 2024

(54) PIXEL SENSORS AND METHODS OF FORMING THE SAME

(71) Applicant: Taiwan Semiconductor Manufacturing Company, Ltd., Hsinchu (TW)

(72) Inventors: Li-Wen Huang, Changhua (TW); Chung-Liang Cheng, Changhua (TW); Ping-Hao Lin, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/152,369

(22) Filed: Jan. 10, 2023

(51) Int. Cl.
*H01L 27/146* (2006.01)

(52) U.S. Cl.
CPC .. *H01L 27/14623* (2013.01); *H01L 27/14625* (2013.01); *H01L 27/14634* (2013.01)

(58) Field of Classification Search
CPC ............. H01L 27/14634; H01L 27/146; H01L 27/14601; H01L 27/1462; H01L 27/14623
See application file for complete search history.

(56) References Cited

U.S. PATENT DOCUMENTS

| | | | | | |
|---|---|---|---|---|---|
| 4,925,276 | A * | 5/1990 | McMurray, Jr. | ...... | G02F 1/1354 349/28 |
| 7,265,890 | B1 * | 9/2007 | Demiryont | ............ | G02F 1/1523 359/275 |
| 8,773,746 | B2 * | 7/2014 | Tajima | ..................... | G02F 1/153 359/267 |
| 10,533,892 | B2 * | 1/2020 | Brown | ....................... | G01J 5/10 |
| 10,638,063 | B2 * | 4/2020 | Borthakur | .............. | H04N 25/11 |
| 11,476,287 | B2 * | 10/2022 | Lee | ................... | H01L 27/14665 |
| 11,670,662 | B2 * | 6/2023 | Lee | ................... | H01L 27/14685 257/72 |
| 2013/0010347 | A1 * | 1/2013 | Tajima | ..................... | C03C 17/36 359/267 |
| 2013/0135505 | A1 * | 5/2013 | Yoshida | ............ | H01L 27/14636 348/311 |
| 2014/0002884 | A1 * | 1/2014 | Marcel | .................. | G02F 1/1524 428/701 |
| 2017/0122802 | A1 * | 5/2017 | Brown | ....................... | E06B 9/24 |
| 2017/0237923 | A1 * | 8/2017 | Gholmansaraei | ...... | H04N 23/75 348/308 |
| 2018/0204865 | A1 * | 7/2018 | Murata | ............. | H01L 27/14609 |
| 2020/0050071 | A1 * | 2/2020 | Ma | .......................... | G02F 1/153 |
| 2022/0163385 | A1 * | 5/2022 | Brown | ....................... | E06B 9/24 |
| 2022/0199658 | A1 * | 6/2022 | Lee | ................... | H01L 27/14685 |

* cited by examiner

*Primary Examiner* — John R Lee
(74) *Attorney, Agent, or Firm* — Harrity & Harrity, LLP

(57) ABSTRACT

An electrode controls transmittance of a blocking layer over a photodiode of a pixel sensor (e.g., a photodiode of a small pixel detector) by changing oxidation of a metal material included in the blocking layer. By using the electrode to adjust transmittance of the blocking layer, pixel sensors for different uses and/or products may be produced using a single manufacturing process. As a result, power and processing resources are conserved that otherwise would have been expended in switching manufacturing processes. Additionally, production time is decreased (e.g., by eliminating downtime that would otherwise have been used to reconfigure fabrication machines.

20 Claims, 19 Drawing Sheets

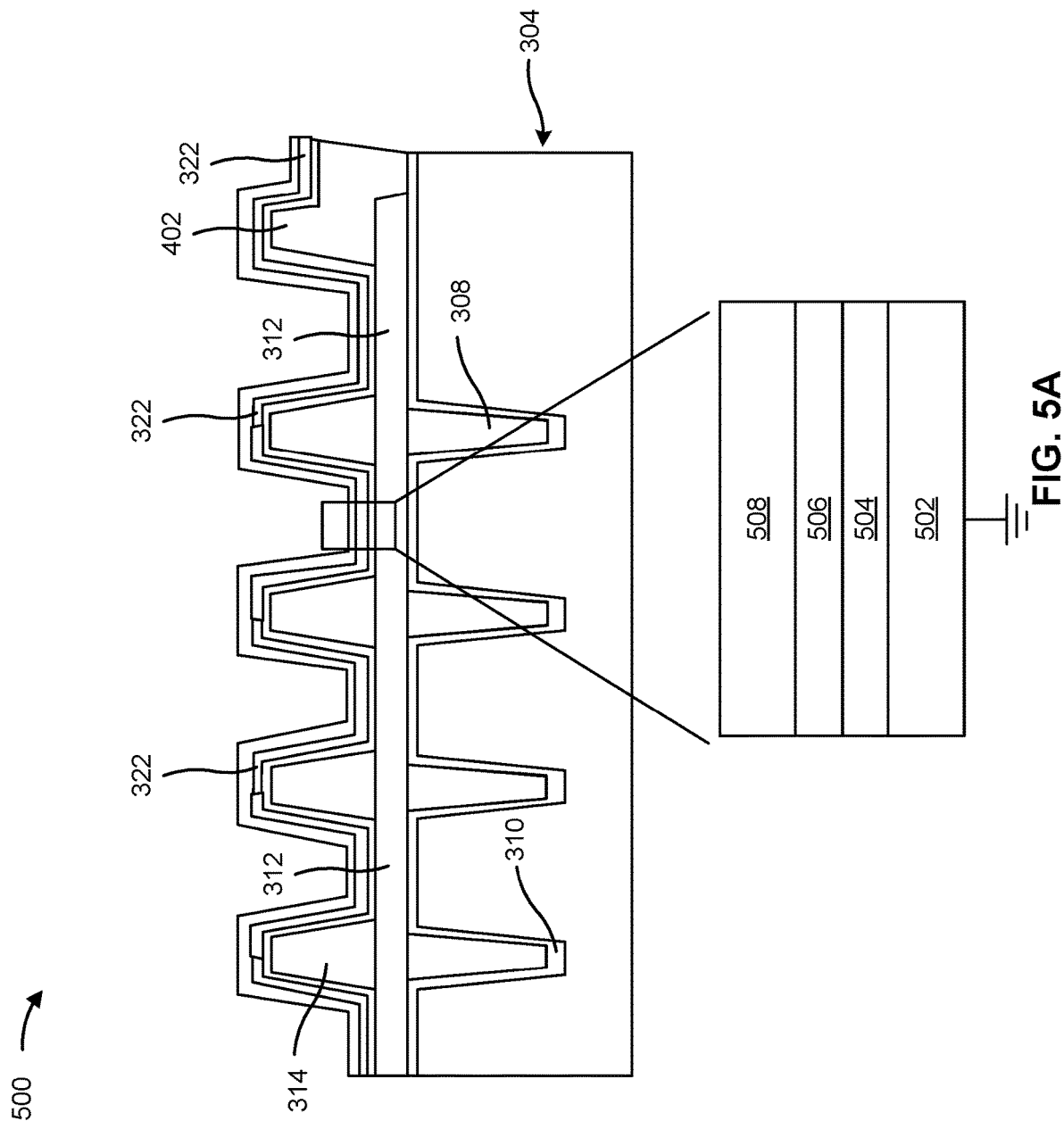

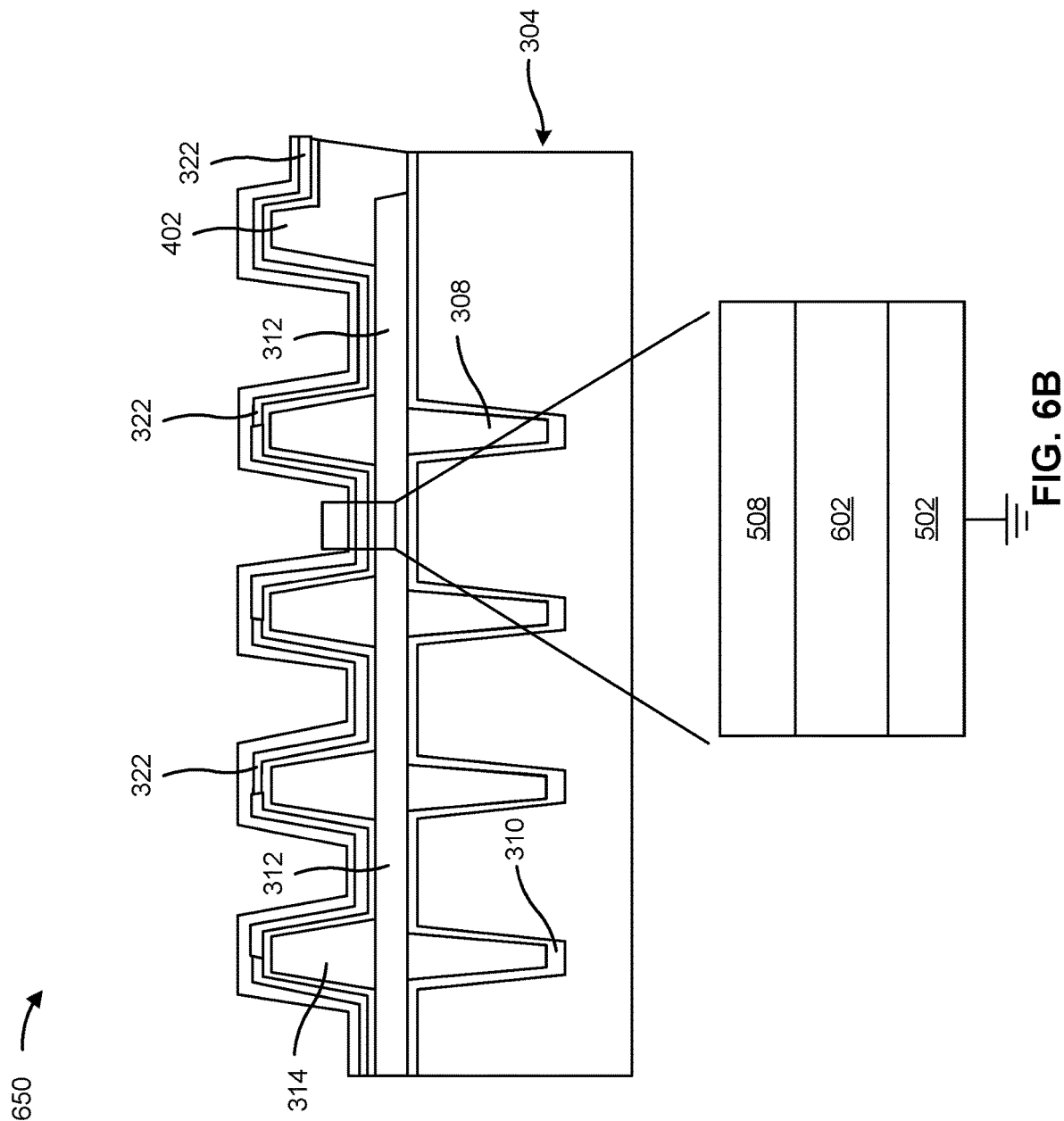

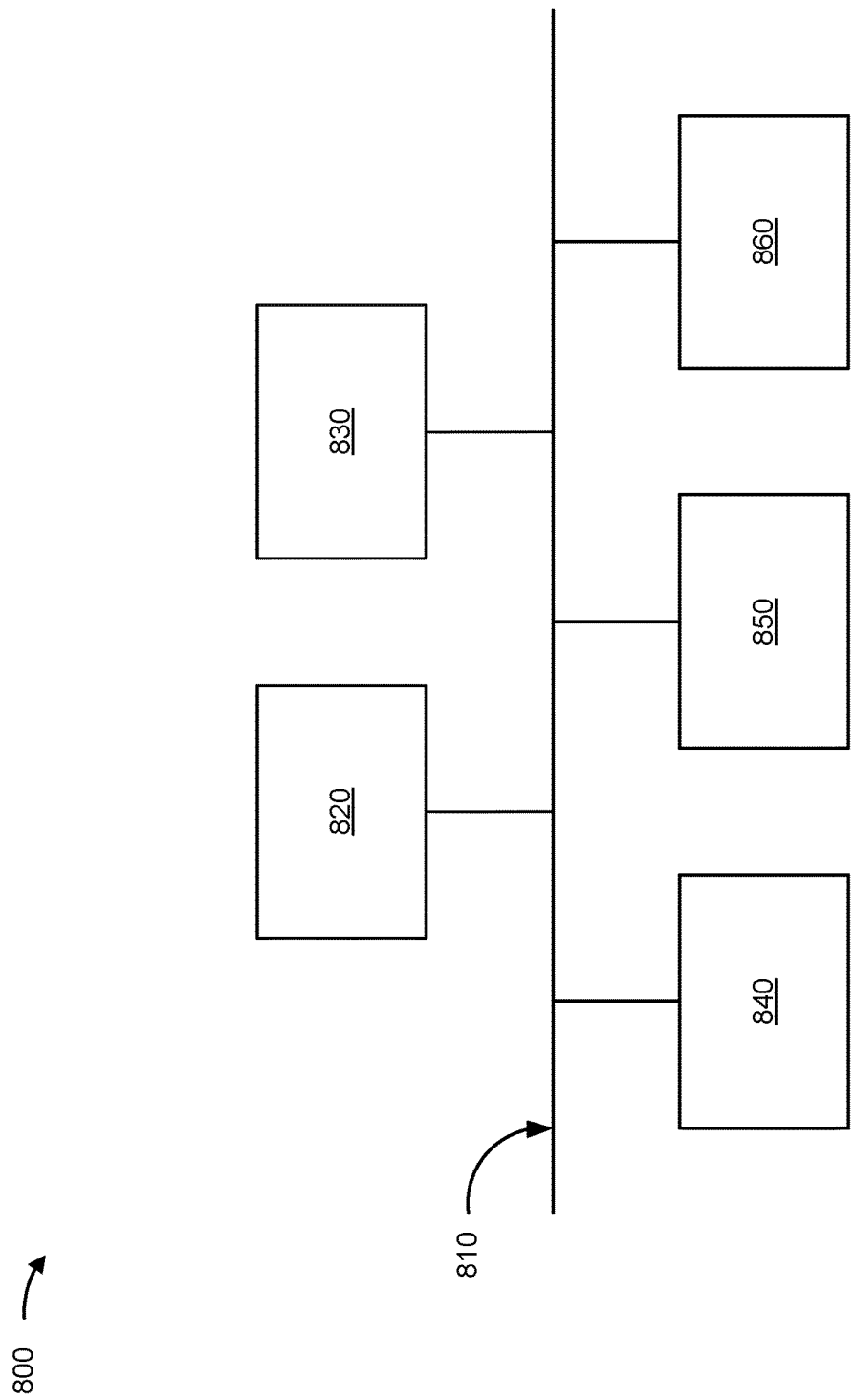

PIXEL SENSORS AND METHODS OF FORMING THE SAME

BACKGROUND

Digital cameras and other optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates read-out of the measurements. One type of image sensor commonly used in optical imaging devices is a back side illumination (BSI) image sensor. BSI image sensor fabrication can be integrated into semiconductor processes for low cost, small size, and high integration. Further, BSI image sensors have low operating voltage, low power consumption, high quantum efficiency, and low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B are diagrams of an example semiconductor structure described herein.

FIGS. 6A and 6B are diagrams of example semiconductor structures described herein.

FIG. 8 is a diagram of example components of one or more devices of FIG. 1 described herein.

DETAILED DESCRIPTION

Figure 1:
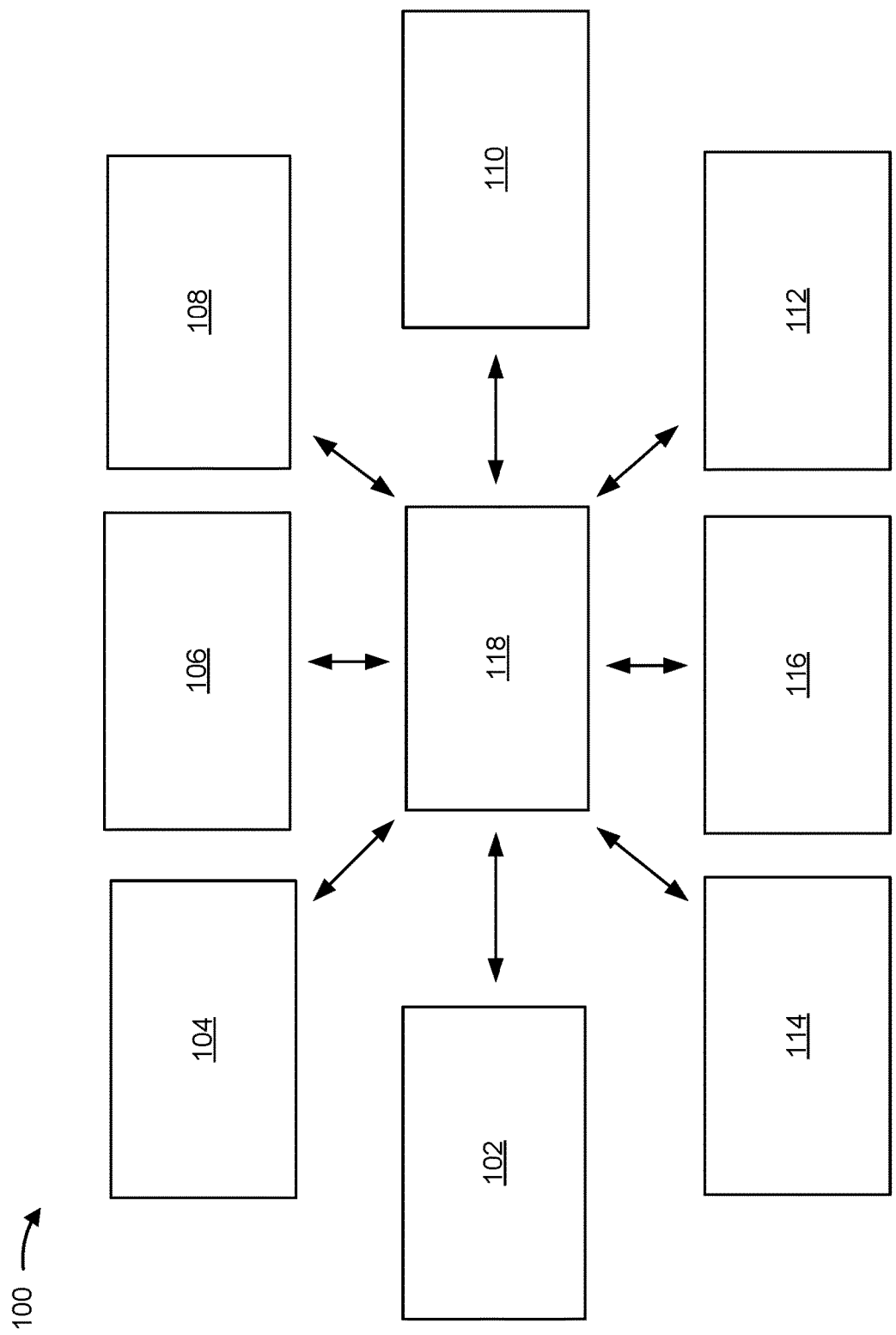
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, (e.g., automotive cases), a pixel array may include a combination of large pixel detectors (LPDs) with small pixel detectors (SPDs). As used herein, "large pixel detector" or "LPD" refers to a pixel that is at least 2 nanometers (nm) on at least one side while "small pixel detector" or "SPD" refers to a pixel that is smaller than 2 nm on all sides. Additionally, a blocking layer (e.g., comprising metal) may be formed over the SPDs. The blocking layer reflects incoming photons before the photons are absorbed by photodiodes of the SPDs. As a result, photons that would otherwise arrive outside of a frame rate for the LPDs are captured and measured by the SPDs. This technique helps capture photons from light-emitting diodes (LEDs) and other sources with flicker and may therefore be referred to as "LED flicker reduction" or "LFR."

The sensitivity of the pixel array to different wavelengths of light depends on a transmittance of the blocking layer. Generally, the transmittance is tuned by modifying a thickness of the blocking layer. However, different use cases therefore require different fabrication processes. Changing fabrication processes results in manufacturing inefficiencies (e.g., downtime while reconfiguring machines) and wastes power, processing resources, and cleaning materials that are used to change from one fabrication process to another.

Some implementations described herein provide techniques and apparatuses for using an electrode to control oxidation of a blocking layer over a photodiode of a pixel sensor (e.g., a photodiode of an SPD). For example, the blocking layer may be formed of an oxide material and a metal material, and a voltage differential across the blocking layer causes oxygen to migrate from the oxide to the metal. Because modifying oxidation of the blocking layer modifies the transmittance of the blocking layer, the electrode may apply different voltages in order to configure the pixel sensor for different use cases without switching manufacturing processes. The electrode may include a pair of electrodes that are bipolar or unipolar or may include a single electrode. The metal blocking layer may include titanium, tungsten, molybdenum, niobium, or a liquid crystal, among other examples. By using an electrode to adjust transmittance of the blocking layer, pixel sensors for different uses and/or products may be produced using a single manufacturing process. As a result, power and processing resources are conserved that otherwise would have been expended in switching manufacturing processes. Additionally, production time is decreased (e.g., by eliminating downtime that would otherwise have been used to reconfigure fabrication machines).

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, an annealing tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, an epitaxy tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form a first metal structure over a first photodiode, forming a second metal structure over a second photodiode that is separated from the first photodiode by a trench isolation structure, form a blocking layer comprising an oxide material and a metal over the first photodiode, and/or form an electrode over the blocking layer, among other examples.

The number and arrangement of devices shown in FIG. 1 are provided as one or more examples. In practice, there may be additional devices, fewer devices, different devices, or differently arranged devices than those shown in FIG. 1. For example, the ion implantation tool 114 may be omitted when photodiodes are fabricated outside the example environment 100. Furthermore, two or more devices shown in FIG. 1 may be implemented within a single device, or a single device shown in FIG. 1 may be implemented as multiple, distributed devices. For example, the deposition tool 102 may include the plating tool 112. Additionally, or alternatively, a set of devices (e.g., one or more devices) of the example environment 100 may perform one or more functions described as being performed by another set of devices of the example environment 100.

Figure 2:
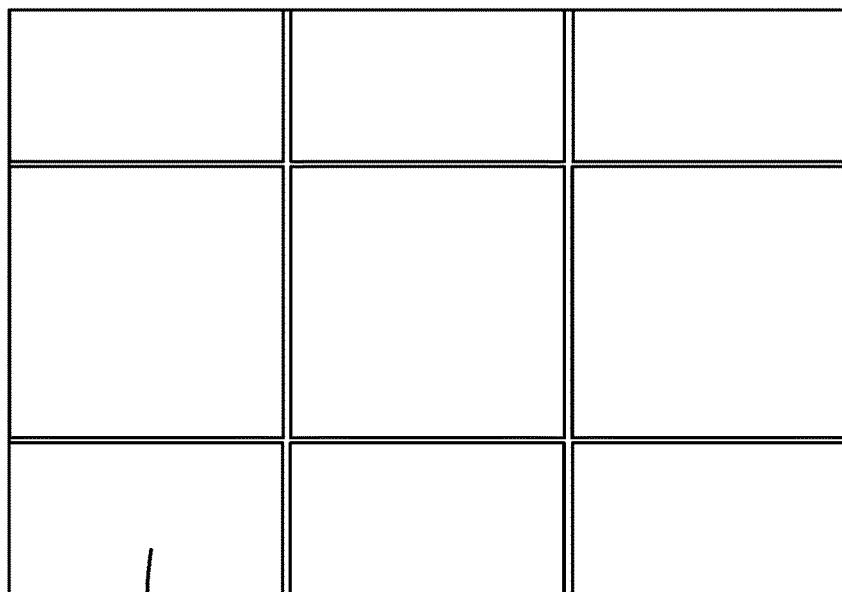
FIGS. 2 and 3 are diagrams of example pixel arrays described herein.

FIG. 2 is a diagram of an example pixel array 200 (or a portion thereof) described herein. The pixel array 200 may be included in an image sensor, such as a complementary metal oxide semiconductor (CMOS) image sensor, a back side illuminated (BSI) CMOS image sensor, or another type of image sensor.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3:
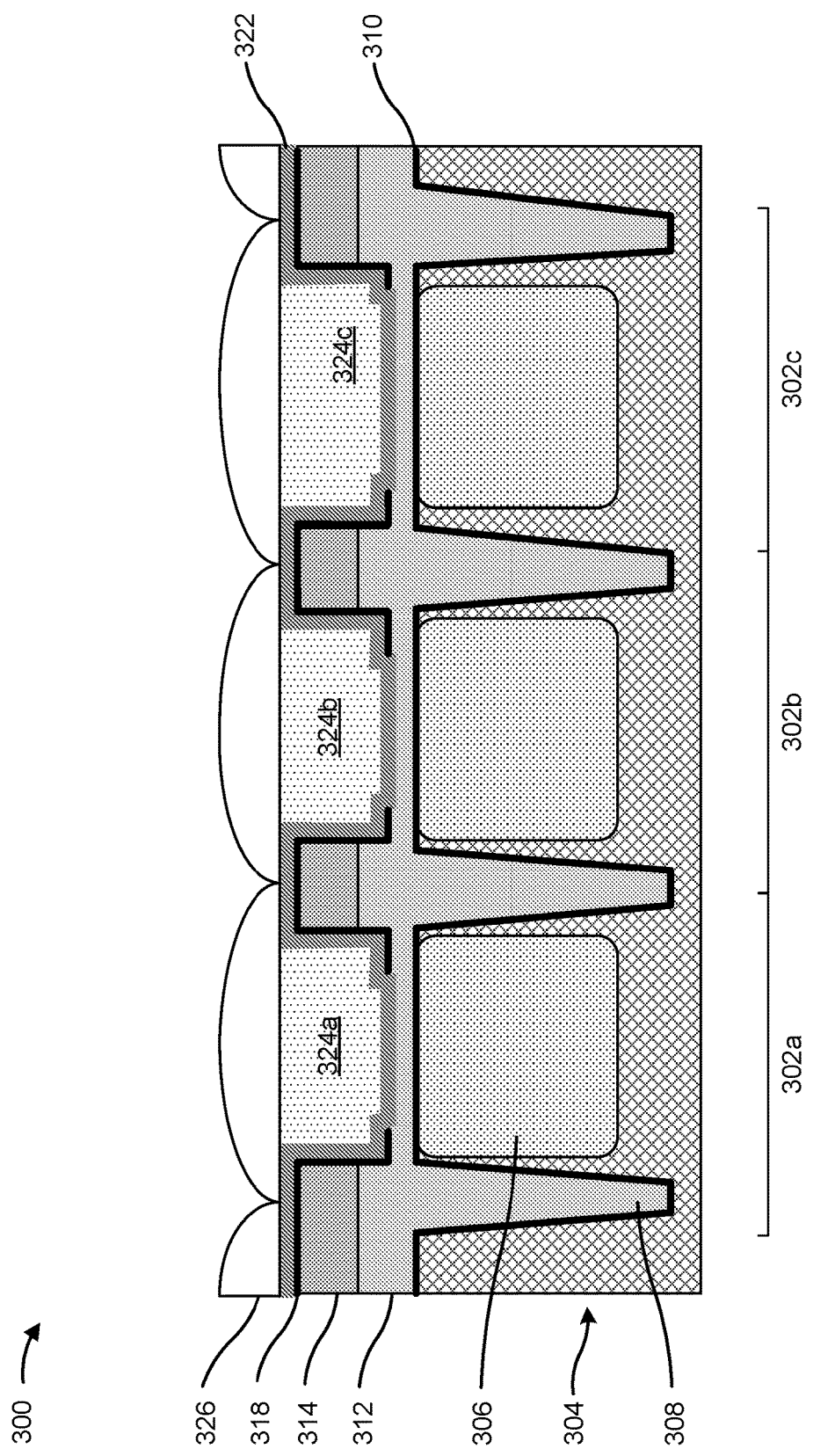

FIG. 3 is a diagram of an example pixel array 300 described herein. The example pixel array 300 includes a blocking layer that blocks and/or reflects some incident photons.

In some implementations, the example pixel array 300 illustrated in FIG. 3 may include, or may be included in, the pixel array 200 (or a portion thereof). In some implementations, the pixel array 300 may be included in an image sensor. The image sensor may be a CMOS image sensor, a BSI CMOS image sensor, or another type of image sensor.

As shown in FIG. 3, the pixel array 300 may include a plurality of adjacent pixel sensors 302, such as pixel sensors 302*a*, 302*b*, and 302*c*. In some implementations, the pixel sensors 302*a*, 302*b*, and 302*c* are configured as square-shaped pixel sensors 202 included in the pixel array 200. In some implementations, the pixel sensors 302*a*, 302*b*, and 302*c* are configured as octagon-shaped pixel sensors and square-shaped pixel sensors. In some implementations, the pixel sensors 302*a*, 302*b*, and 302*c* include other shape(s) of pixel sensors or a combination thereof.

The pixel sensors 302 may be formed in a substrate 304, which may include a semiconductor die substrate, a semiconductor wafer, or another type of substrate in which semiconductor pixels may be formed. In some implementations, the substrate 304 is formed of silicon (Si), a material including silicon, a III-V compound semiconductor material such as gallium arsenide (GaAs), a silicon on insulator (SOI), or another type of semiconductor material that is capable of generating a charge from photons of incident light.

Each pixel sensor 302 may include a photodiode 306. A photodiode 306 may include a region of the substrate 304 that is doped with a plurality of types of ions to form a p-n junction or a PIN junction (e.g., a junction between a p-type portion, an intrinsic (or undoped) type portion, and an n-type portion). For example, the substrate 304 may be doped with an n-type dopant to form a first portion (e.g., an n-type portion) of a photodiode 306 and a p-type dopant to form a second portion (e.g., a p-type portion) of the photodiode 306. A photodiode 306 may be configured to absorb photons of incident light. The absorption of photons causes a photodiode 306 to accumulate a charge (referred to as a photocurrent) due to the photoelectric effect. Here, photons bombard the photodiode 306, which causes emission of electrons of the photodiode 306. The emission of electrons causes the formation of electron-hole pairs, where the electrons migrate toward the cathode of the photodiode 306 and the holes migrate toward the anode, which produces the photocurrent.

An isolation structure 308 may be included in the substrate 304 between adjacent pixel sensors 302. The isolation structure 308 may provide optical isolation by blocking or preventing diffusion or bleeding of light from one pixel sensor 302 to another pixel sensor 302, thereby reducing crosstalk between adjacent pixel sensors 302. The isolation structure 308 may include trenches or deep trench isolation (DTI) structures that are coated or lined with an antireflective coating (ARC) 310 and filled with an oxide layer 312 (e.g., over the ARC 310). The isolation structure 308 may be formed in a grid layout in which the isolation structure 308 extends around the perimeters of the pixel sensors 302 in the pixel array 300 and intersects at various locations of the pixel array 300. In some implementations, the isolation structure 308 is formed in the backside of the substrate 304 to provide optical isolation between the pixel sensors 302, and thus may be referred to as a backside DTI (BDTI) structure.

The ARC 310 may be included within the isolation structures 308 and on the substrate 304 above the photodiodes 306. The ARC 310 may include a suitable material for reducing a reflection of incident light projected toward the photodiodes 306. For example, the ARC 310 may include nitrogen-containing material.

The oxide layer 312 may function as a dielectric buffer layer between the photodiodes 306 and the layers above the photodiodes 306. The oxide layer 312 may include an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another dielectric material that is capable of providing optical isolation between the pixel sensors 302.

A metal layer 314 may be included above and/or on the oxide layer 312. The metal layer 314 may include a metallic material such as tungsten (W), copper (Cu), aluminum (Al), cobalt (Co), nickel (Ni), titanium (Ti), tantalum (Ta), another conductive material, and/or an alloy including one or more of the foregoing. To further reduce crosstalk between adjacent pixel sensors 302, a blocking layer 318 may be included over and/or on the metal layer 314. The blocking layer 318 blocks and/or reflects incident light in order to delay incoming photons to the photodiodes 306.

A passivation layer 322 may be included over the blocking layer 318 and over the portions of the oxide layer 312 that are not covered by the blocking layer 318. The passivation layer 322 may include a dielectric material to provide protection for the layers beneath the passivation layer 322 from the layers and structures that are formed above the passivation layer 322.

Respective color filter regions 324 may be included over the photodiodes 306. For example, a color filter region 324a may be formed over the photodiode 306 of the pixel sensor 302a, a color filter region 324b may be formed over the photodiode 306 of the pixel sensor 302b, a color filter region 324c may be formed over the photodiode 306 of the pixel sensor 302c, and so on. Alternatively, the areas over the photodiodes 306 may be completely filled with the passivation layer 322, and a color filter layer including the color filter regions 324 may be formed on the passivation layer 322.

Each color filter region 324 may be configured to filter incident light to allow a particular wavelength of the incident light to pass to a photodiode 306 of an associated pixel sensor 302. A micro-lens layer 326 may be included above and/or on the color filter regions 324. The micro-lens layer 326 may include a respective micro-lens for each of the pixel sensors 302. For example, a micro-lens may be formed to focus incident light toward the photodiode 306 of the pixel sensor 302a, another micro-lens may be formed to focus incident light toward the photodiode 306 of the pixel sensor 302b, another micro-lens may be formed to focus incident light toward the photodiode 306 of the pixel sensor 302c, and so on.

As indicated above, FIG. 3 is provided as an example. Other examples may differ from what is described with regard to FIG. 3.

Figure 4:
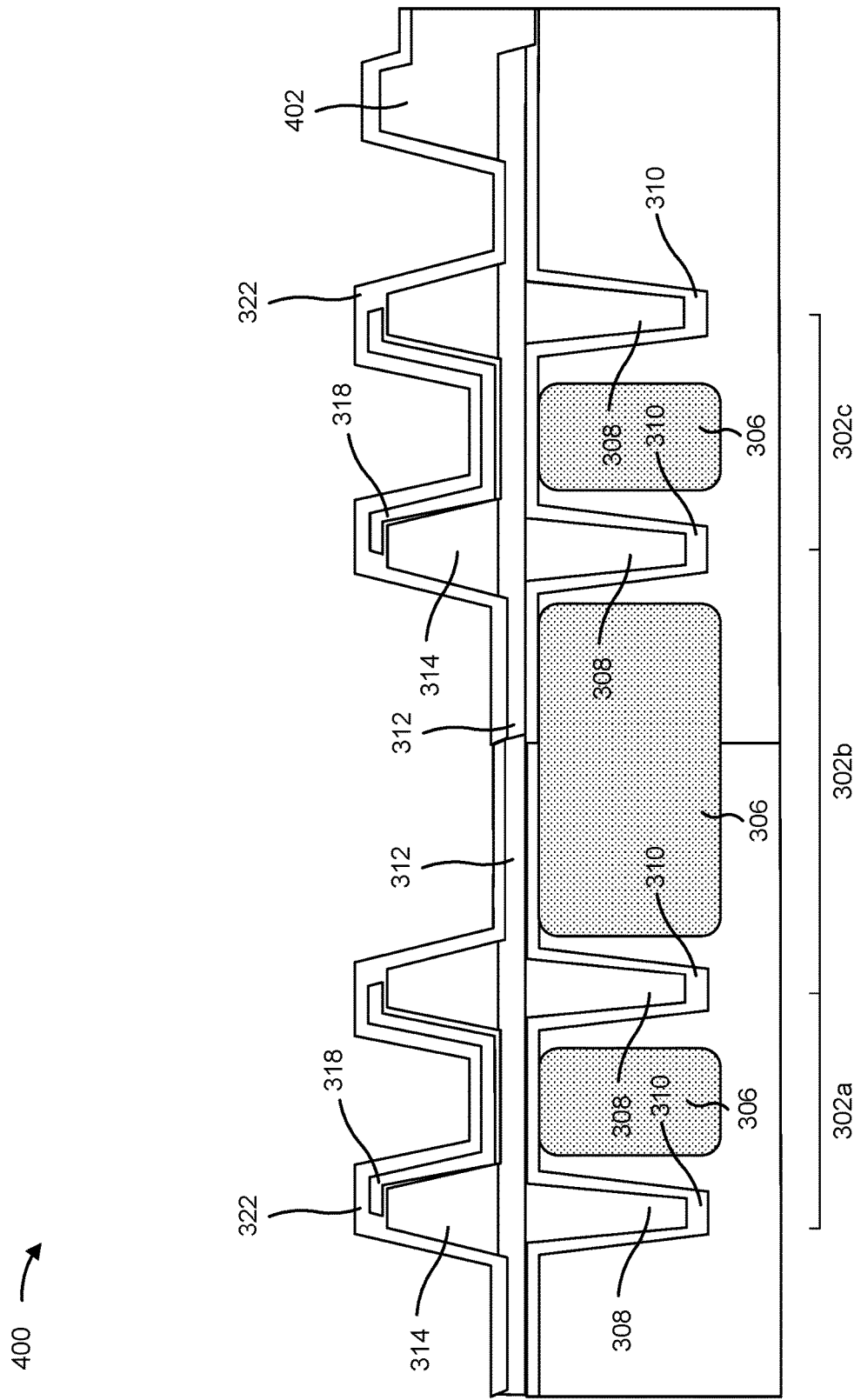
FIG. 4 is a diagram of an example semiconductor structure described herein.

FIG. 4 is a diagram of an example pixel array 400 described herein. The example pixel array 400 is similar to the pixel array 300, except that the example pixel array 400 includes a combination of LPDs and SPDs and provides a blocking layer over the SPDs and not over the LPDs. The blocking layer being disposed over the SPDs enables LFR.

In some implementations, the example pixel array 400 illustrated in FIG. 4 may include, or may be included in, the pixel array 200 (or a portion thereof). In some implementations, the pixel array 400 may be included in an image sensor. The image sensor may be a CMOS image sensor, a BSI CMOS image sensor, or another type of image sensor.

As shown in FIG. 4, the pixel array 400 may include a plurality of adjacent pixel sensors 302, such as pixel sensors 302a, 302b, and 302c. In some implementations, the pixel sensors 302a, 302b, and 302c are configured as square-shaped pixel sensors 202 included in the pixel array 200. In some implementations, the pixel sensors 302a, 302b, and 302c are configured as octagon-shaped pixel sensors and square-shaped pixel sensors. In some implementations, the pixel sensors 302a, 302b, and 302c include other shape(s) of pixel sensors or a combination thereof. Additionally, the pixel sensors 302a, 302b, and 302c may be different sizes. For example, as shown in FIG. 4, the pixel sensors 302a and 302c may be SPDs while the pixel sensor 302b may be an LPD. By combining LPDs and SPDs, the example pixel array 400 may configure the SPDs to receive and measure photons that the LPDs would otherwise miss, thereby improving accuracy of the example pixel array 400.

Similarly as described in connection with FIG. 3, the pixel sensors 302 may be formed in a substrate, and each pixel sensor 302 may include a photodiode 306. An isolation structure 308 (e.g., a DTI structure) may be included in the substrate 304 between adjacent pixel sensors 302. As described in connection with FIG. 3, the isolation structure 308 may be coated or lined with an ARC 310 and filled with an oxide layer 312 (e.g., over the ARC 310).

Similarly as described in connection with FIG. 3, a metal layer 314 may be included above and/or on the oxide layer 312. The metal layer 314 may include a metallic material such as tungsten (W), copper (Cu), aluminum (Al), cobalt (Co), nickel (Ni), titanium (Ti), tantalum (Ta), another conductive material, and/or an alloy including one or more of the foregoing.

Additionally, a blocking layer 318 may be included over the SPDs 302a and 302c. The blocking layer 318 blocks and/or reflects incident light in order to delay incoming photons to the photodiodes 306 of the SPDs. As a result, photons that would otherwise have been missed by the LPD 302b are slowed by the blocking layer 318 and then absorbed and measured by the SPDs 302a and 302c. Accordingly, the example pixel array 400 uses the blocking layer 318 in combination with the SPDs to implement LFR.

A passivation layer 322 may be included over the blocking layer 318 and over the portions of the oxide layer 312 that are not covered by the blocking layer 318. Similarly as described in connection with FIG. 3, the passivation layer 322 may include a dielectric material. For example, the passivation layer 322 may include a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another dielectric material.

In some implementations, the example pixel array 400 may additionally include a grounding node 402. The grounding node 402 may include a metallic material such as tungsten (W), copper (Cu), aluminum (Al), cobalt (Co), nickel (Ni), titanium (Ti), tantalum (Ta), another conductive material, and/or an alloy including one or more of the foregoing. The grounding node 402 may electrically reset the pixel sensors 302 of the example pixel array 400.

As indicated above, FIG. 4 is provided as an example. Other examples may differ from what is described with regard to FIG. 4.

FIG. 5A is a diagram of an example pixel array 500 described herein. The example pixel array 500 is similar to the pixel array 400, except that the example pixel array 500 includes a tunable blocking layer.

In some implementations, the example pixel array 500 illustrated in FIG. 5A may include, or may be included in, the pixel array 200 (or a portion thereof). In some implementations, the pixel array 500 may be included in an image sensor. The image sensor may be a CMOS image sensor, a BSI CMOS image sensor, or another type of image sensor.

The pixel array 500 may include a plurality of adjacent pixel sensors. Similarly as described in connection with FIG. 3, the pixel sensors may be formed in a substrate 304, and each pixel sensor may include a photodiode. As described in connection with FIG. 4, some pixel sensors may be LPDs while other pixel sensors are SPDs. An isolation structure 308 (e.g., a DTI structure) may be included in the substrate between adjacent pixel sensors. As described in connection with FIG. 3, the isolation structure 308 may be coated or lined with an ARC 310 and filled with an oxide layer 312 (e.g., over the ARC 310).

Similarly as described in connection with FIG. 3, a metal layer 314 may be included above and/or on the oxide layer 312. The metal layer 314 may include a metallic material such as tungsten (W), copper (Cu), aluminum (Al), cobalt (Co), nickel (Ni), titanium (Ti), tantalum (Ta), another conductive material, and/or an alloy including one or more of the foregoing.

Additionally, a blocking layer may be included over the SPDs. As shown in FIG. 5A, the blocking layer includes a bottom electrode 502, an oxide layer 504, a metal layer 506, and a top electrode 508. The bottom electrode 502 and the top electrode 508 may be transparent electrodes. For example, the bottom electrode 502 and the top electrode 508 may be indium tin oxide (ITO) electrodes. As a result, any loss in transmittance through the blocking layer caused by the electrodes 502 and 508 is small enough to satisfy a loss threshold.

The oxide layer 504 may include a hafnium oxide ($HfO_2$), zirconium oxide ($ZrO_2$), or another oxide material. A thickness of the oxide layer 504 may be in a range from approximately 500 Angstroms (Å) to approximately 2000 Å. Selecting a thickness of at least 500 Å ensures that the oxide layer 504 includes enough oxygen atoms to allow migration into the metal layer 506 to adjust a transmittance of the blocking layer. Selecting a thickness of no more than 2000 Å ensures that the blocking layer remains sufficiently transparent even with the oxide layer 504. However, other values for the thickness of the oxide layer 504 are within the scope of the present disclosure.

The metal layer 506 may include titanium (Ti) (or a non-oxide titanium compound, such as titanium nitride (TiN)), tungsten (W), molybdenum (Mo), niobium (Nb), or another type of metal or non-oxide metal compound. A thickness of the metal layer 506 may be in a range from approximately 50 Å to approximately 1000 Å. Selecting a thickness of at least 50 Å ensures that the metal layer 506 may accept enough oxygen atoms from the oxide layer 504 to adjust a transmittance of the blocking layer. Selecting a thickness of no more than 1000 Å ensures that the blocking layer remains sufficiently transparent even with the metal layer 506. However, other values for the thickness of the metal layer 506 are within the scope of the present disclosure.

As described in connection with FIG. 5B below, the electrodes 502 and 508 may provide a voltage differential across the oxide layer 504 and the metal layer 506 that causes oxygen atoms to migrate from the oxide layer 504 to the metal layer 506. In some implementations, the electrodes 502 and 508 may be bipolar. For example, the electrodes 502 and 508 may generate a voltage in a range from approximately −2.0 Volts (V) to approximately 2.0 V. Selecting a voltage in the range from approximately −2.0 V to approximately 2.0 V allows the electrodes 502 and 508 to adjust a transmittance of the blocking layer without impeding the operation of the pixel sensors with electromagnetic interference. However, other values for the voltage are within the scope of the present disclosure. Alternatively, the electrodes 502 and 508 may be unipolar. For example, the electrodes 502 and 508 may generate a voltage in a range from approximately 0.0 V to approximately 4.0 V. Selecting a voltage in the range from approximately 0.0 V to approximately 4.0 V allows the electrodes 502 and 508 to adjust a transmittance of the blocking layer without impeding the operation of the pixel sensors with electromagnetic interference. However, other values for the voltage are within the scope of the present disclosure.

An isolation layer 322 may be included over the blocking layer 318 and over the portions of the oxide layer 312 that are not covered by the blocking layer 318. Similar to the passivation layer described in connection with FIG. 3, the isolation layer 322 may include a dielectric material. For example, the isolation layer 322 may include a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another dielectric material. A thickness of the isolation layer 322 may be in a range from approximately 50 Å to approximately 100 Å. Selecting a thickness of at least 50 Å ensures that the isolation layer 322 sufficiently isolates segments of the blocking layer from each other. Selecting a thickness of no more than 100 Å ensures that the isolation layer 322 remains sufficiently transparent. However, other values for the thickness of the isolation layer 322 are within the scope of the present disclosure.

In some implementations, the example pixel array 500 may additionally include a grounding node 402. The grounding node 402 may ground the bottom electrode 502, as shown in FIG. 5A. In other implementations, the grounding node 402 may ground the top electrode 508 such that the voltage differential is controlled via the bottom electrode 502.

Figure 5B:
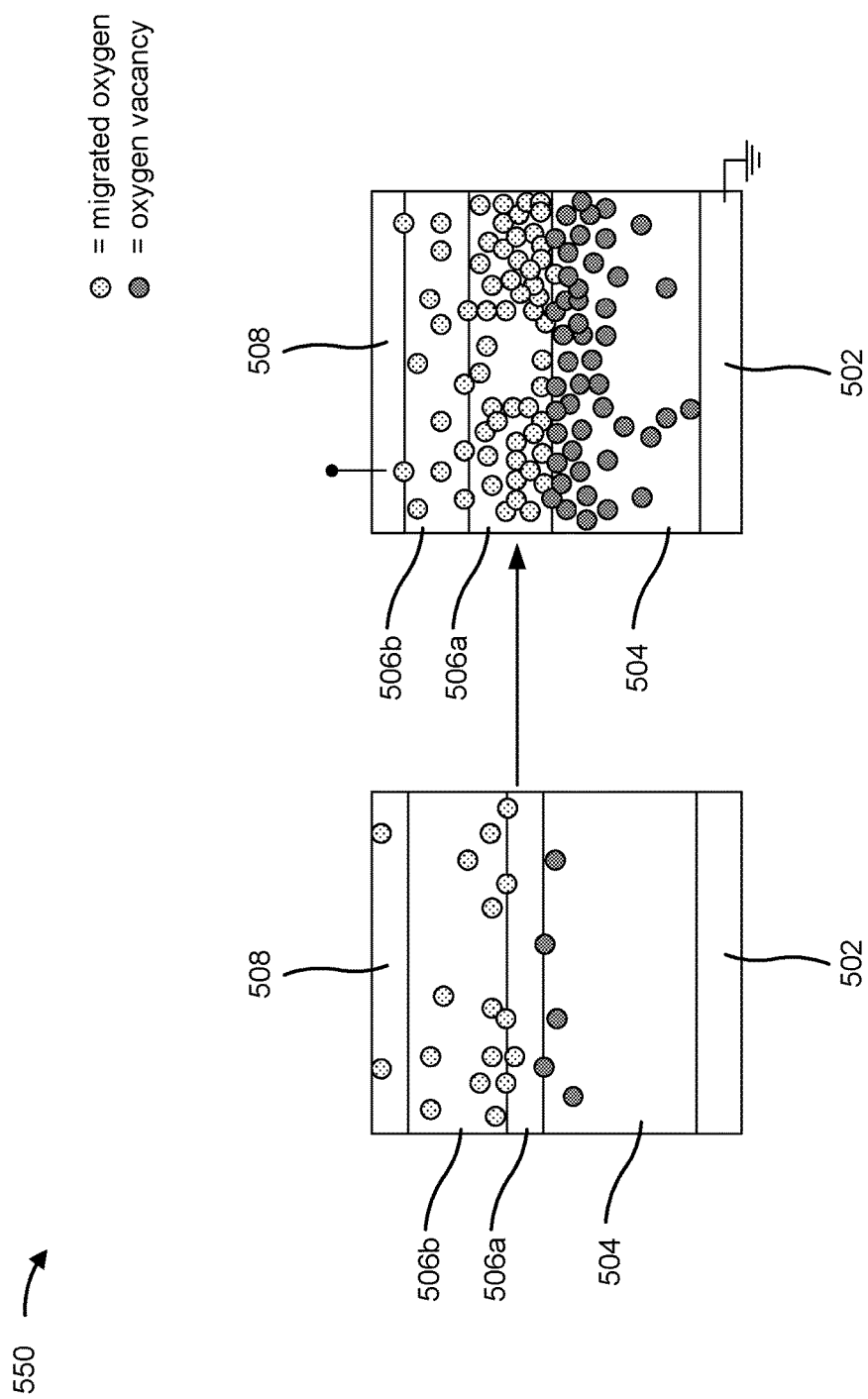

FIG. 5B shows a more detailed view 550 of the blocking layer of the example pixel array 500. As shown in FIG. 5B, oxygen atoms migrate from the oxide layer 504 to the metal layer 506 when the electrodes 502 and 508 apply a voltage differential across the oxide layer 504 and the metal layer 506. Accordingly, the metal layer 506 may include a metal oxide layer 506a that has accepted an amount of oxygen from the oxide layer 504 that satisfies an oxide threshold and a metal layer 506b that has accepted an amount of oxygen from the oxide layer 504 that fails to satisfy the oxide threshold. As a result, the transmittance of the blocking layer is modified. For example, when the metal layer 506 comprises titanium, increased oxygenation results in higher transmittance.

As indicated above, FIGS. 5A and 5B are provided as examples. Other examples may differ from what is described with regard to FIGS. 5A and 5B.

Figure 6A:
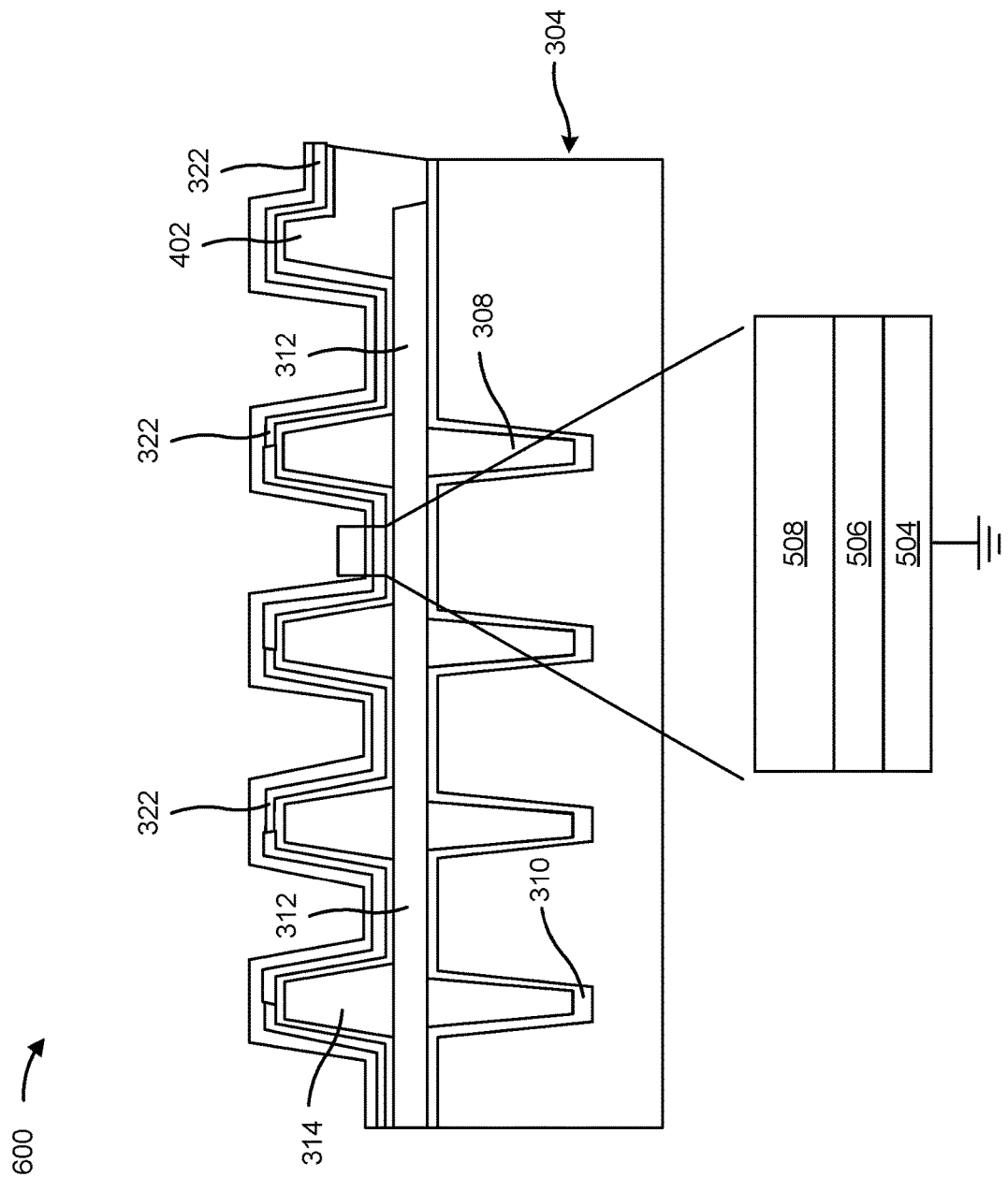

FIG. 6A is a diagram of an example pixel array 600 described herein. The example pixel array 600 is similar to the pixel array 500, except that the example pixel array 600 includes a single electrode rather than two electrodes. Using a single electrode conserves raw materials, power, and processing resources during manufacturing.

In some implementations, the example pixel array 600 illustrated in FIG. 6A may include, or may be included in, the pixel array 200 (or a portion thereof). In some implementations, the pixel array 600 may be included in an image sensor. The image sensor may be a CMOS image sensor, a BSI CMOS image sensor, or another type of image sensor.

Similar to the example pixel array 500, a blocking layer may be included over SPDs of the example pixel array 600. As shown in FIG. 6A, the blocking layer includes an oxide layer 504, a metal layer 506, and a top electrode 508. Accordingly, the top electrode 508 may provide a voltage differential across the oxide layer 504 and the metal layer 506 that causes oxygen atoms to migrate from the oxide layer 504 to the metal layer 506. By omitting the bottom electrode 502, the example pixel array 600 may be fabricated more quickly and with less raw materials, power, and processing resources. Alternatively, the top electrode 508 may be omitted such that the pixel sensor includes only the bottom electrode 502.

The example pixel array 600 may additionally include a grounding node 402. The grounding node 402 may ground the oxide layer 504 because the bottom electrode 502 is omitted, as shown in FIG. 6A. In implementations where the top electrode 508 is omitted in favor of the bottom electrode 502, the grounding node 402 may ground the oxide layer such that the voltage differential is controlled via the bottom electrode 502.

FIG. 6B is a diagram of an example pixel array 650 described herein. The example pixel array 650 is similar to the pixel array 500, except that a blocking layer of the example pixel array 650 includes a liquid crystal rather than an oxide layer and a metal layer. Using a liquid crystal may provide greater selectivity for a transmittance of the blocking layer.

In some implementations, the example pixel array 650 illustrated in FIG. 6B may include, or may be included in, the pixel array 200 (or a portion thereof). In some implementations, the pixel array 650 may be included in an image sensor. The image sensor may be a CMOS image sensor, a BSI CMOS image sensor, or another type of image sensor.

Similar to the example pixel array 500, a blocking layer may be included over SPDs of the example pixel array 650. As shown in FIG. 6B, the blocking layer includes a bottom electrode 502, a liquid crystal 602, and a top electrode 508. Accordingly, the electrodes 502 and 508 may provide a voltage differential across the liquid crystal 602 that causes oxygen atoms to migrate from the oxide layer 504 to the metal layer 506. By using the liquid crystal 602, a transmittance of the blocking layer may be adjusted with greater sensitivity. In some implementations, the liquid crystal 602 includes a polymer-dispersed liquid crystal (PDLC). Although the example pixel array 650 includes both electrodes, other examples may include only a top electrode (e.g., as shown in FIG. 6A) or only a bottom electrode (e.g., as described in connection with FIG. 6A).

In some implementations, the example pixel array 650 may additionally include a grounding node 402. The grounding node 402 may ground the bottom electrode 502, as shown in FIG. 6B. In other implementations, the grounding node 402 may ground the top electrode 508 such that the voltage differential is controlled via the bottom electrode 502.

As indicated above, FIGS. 6A and 6B are provided as examples. Other examples may differ from what is described with regard to FIGS. 6A and 6B.

FIGS. 7A-7I are diagrams of an example implementation 700 described herein. Example implementation 700 may be an example process for forming the example pixel array 500 having a blocking layer included therein. In some implementations, the example techniques and procedures described in connection with FIGS. 7A-7I may be used in connection with other pixel arrays described herein, such as the example pixel array 600 described in connection with FIG. 6A and/or the example pixel array 650 described in connection with FIG. 6B. The example pixel array formed using example implementation 700 may be included in a CMOS image sensor, a BSI CMOS image sensor, or another type of image sensor.

Figure 7A:
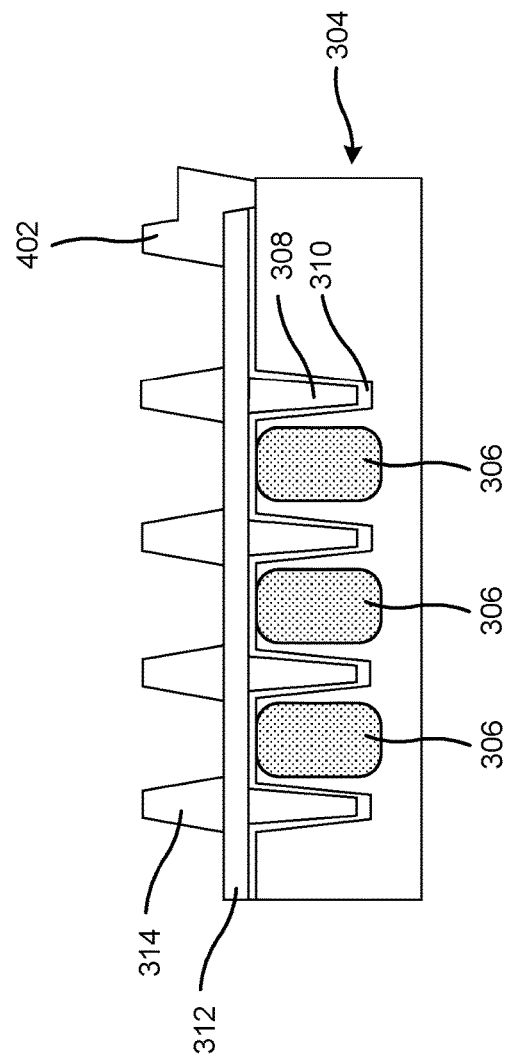
FIGS. 7A-7I are diagrams of an example implementation described herein.

As shown in FIG. 7A, the example process for forming the pixel array may be performed in connection with a substrate 304. As described above, the substrate 304 may include a semiconductor die substrate, a semiconductor wafer, a stacked semiconductor wafer, or another type of substrate in which semiconductor pixels may be formed. For example, the substrate 304 may be formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 304 is formed of a doped material (e.g., a p-doped material or an n-doped material) such as a doped silicon. Additionally, the substrate 304 may have photodiodes 306 formed therein. For example, some of the photodiodes 306 may be included in SPDs while others of the photodiodes 306 may be included in LPDs.

As further shown in FIG. 7A, an isolation structure 308 (e.g., a DTI structure) may be included in the substrate 304 between adjacent photodiodes 306. The isolation structure 308 may be coated or lined with an ARC 310 and filled with an oxide layer 312 (e.g., over the ARC 310).

As further shown in FIG. 7A, one or more metal structures (e.g., portions of a metal layer 314) may be formed over the isolation structure 308. For example, the deposition tool 102 may form the metal layer 314 over and/or on the frontside surface of the substrate 304 (e.g., over the oxide layer 312). In some implementations, the deposition tool 102 may form the metal layer 314 using a spin-coating technique, a CVD technique, a PVD technique, an ALD technique, and/or another deposition technique. In some implementations, the metal layer 314 may be formed over the entire oxide layer 312. Accordingly, the deposition tool 102 may form a photoresist layer over and/or on the frontside surface of the metal layer 314, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the metal layer 314 formed over the photodiodes 306 rather than the isolation structure 308. For example, the etch tool 108 may use a wet etch technique, a dry etch technique, a plasma-enhanced etch technique, and/or another type of etch technique to etch the portion of the metal layer 314. A photoresist removal tool may remove the remaining portions of the photoresist layer (e.g., using a chemical stripper, a plasma asher, and/or another technique) after the etch tool 108 etches the metal layer to form the metal structures. In addition to the metal layer 314, the grounding node 402 may be formed. For example, the grounding node 402 may be formed concurrently with the metal structures.

Figure 7B:
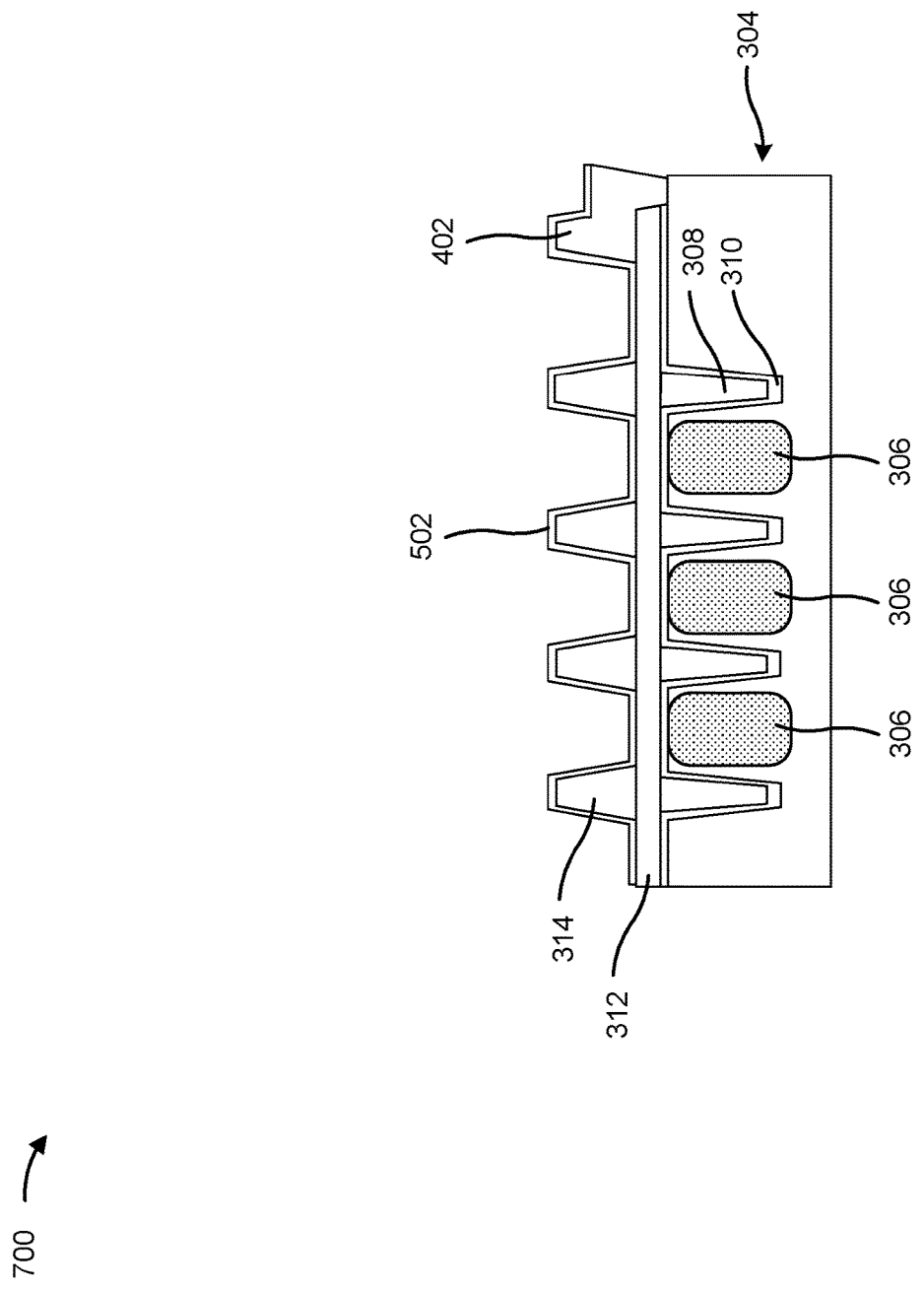

As shown in FIG. 7B, a bottom electrode 502 may be formed over the photodiodes 306 and the isolation structure 308. For example, the deposition tool 102 may form the bottom electrode 502 over and/or on the frontside surface of the substrate 304 (e.g., over the metal layer 314 and the oxide layer 312). In some implementations, the deposition tool 102 may form the bottom electrode 502 using a spin-coating technique, a CVD technique, a PVD technique, an ALD technique, and/or another deposition technique.

Figure 7C:
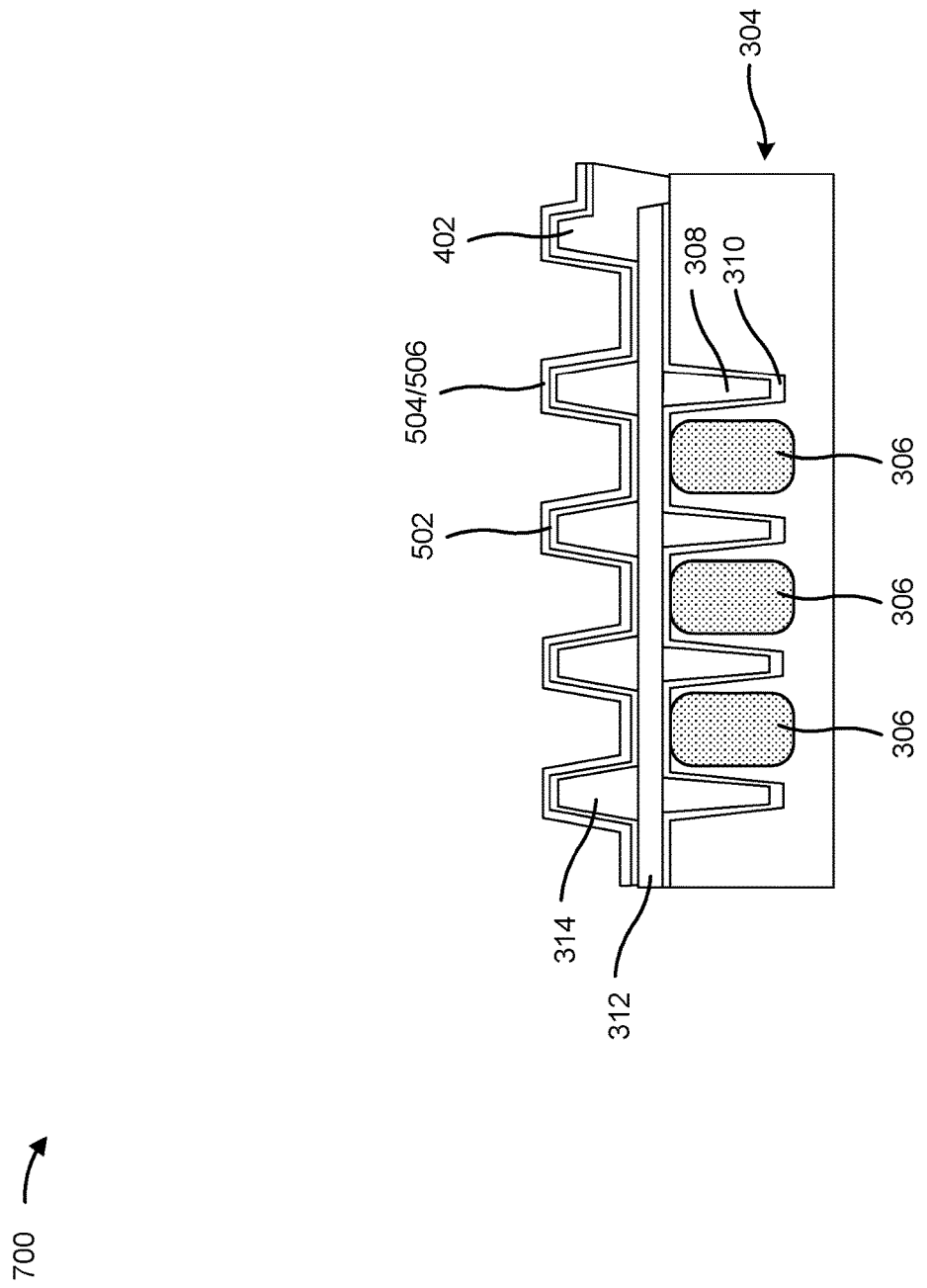

As shown in FIG. 7C, a blocking layer may be formed over the photodiodes 306 and the isolation structure 308. For example, the deposition tool 102 may form the blocking layer over and/or on the frontside surface of the substrate 304 (e.g., over the bottom electrode 502, the metal layer 314, and the oxide layer 312). In some implementations, the deposition tool 102 may form the blocking layer using a spin-coating technique, a CVD technique, a PVD technique, an ALD technique, and/or another deposition technique.

In example implementation 700, the blocking layer includes an oxide layer 504 and a metal layer 506. Accordingly, the deposition tool 102 may perform back-to-back deposition procedures in order to form the blocking layer. Alternatively, the blocking layer may include a liquid crystal 602, as described in connection with FIG. 6B. Accordingly, the deposition tool 102 may perform a single deposition procedure in order to form the blocking layer.

In implementations that exclude the bottom electrode 502 (e.g., as shown in FIG. 6A), the blocking layer may be formed directly on the metal layer 314 and the oxide layer 312.

Figure 7D:
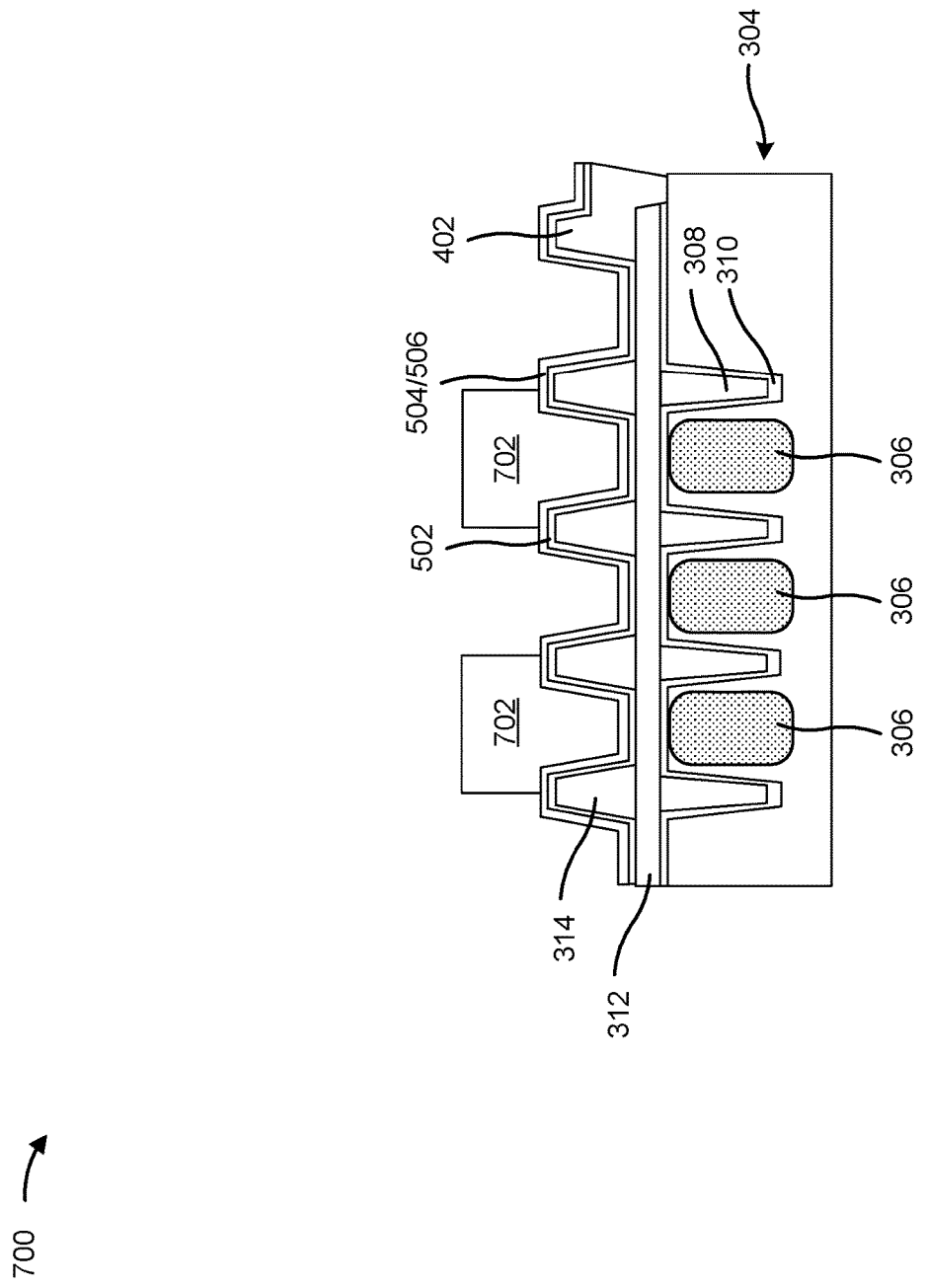

As shown in FIG. 7D, one or more masking layers (e.g., a photoresist layer 702 in example implementation 700) may be formed over the blocking layer. For example, the deposition tool 102 may form the photoresist layer 702 over and/or on the frontside surface of the substrate 304 (e.g., over the blocking layer). In some implementations, the deposition tool 102 may form the photoresist layer 702 using a spin-coating technique, a CVD technique, a PVD technique, an ALD technique, and/or another deposition technique. In some implementations, the photoresist layer 702 may be formed over the entire blocking layer. Accordingly, the exposure tool 104 may expose the photoresist layer 702 to a radiation source to form a pattern on the photoresist layer 702, and the developer tool 106 may develop and remove portions of the photoresist layer 702 to expose the pattern. As shown in FIG. 7D, the pattern may be such that the photoresist layer 702 is over photodiodes 306 of SPDs rather than photodiodes 306 of LPDs.

Figure 7E:
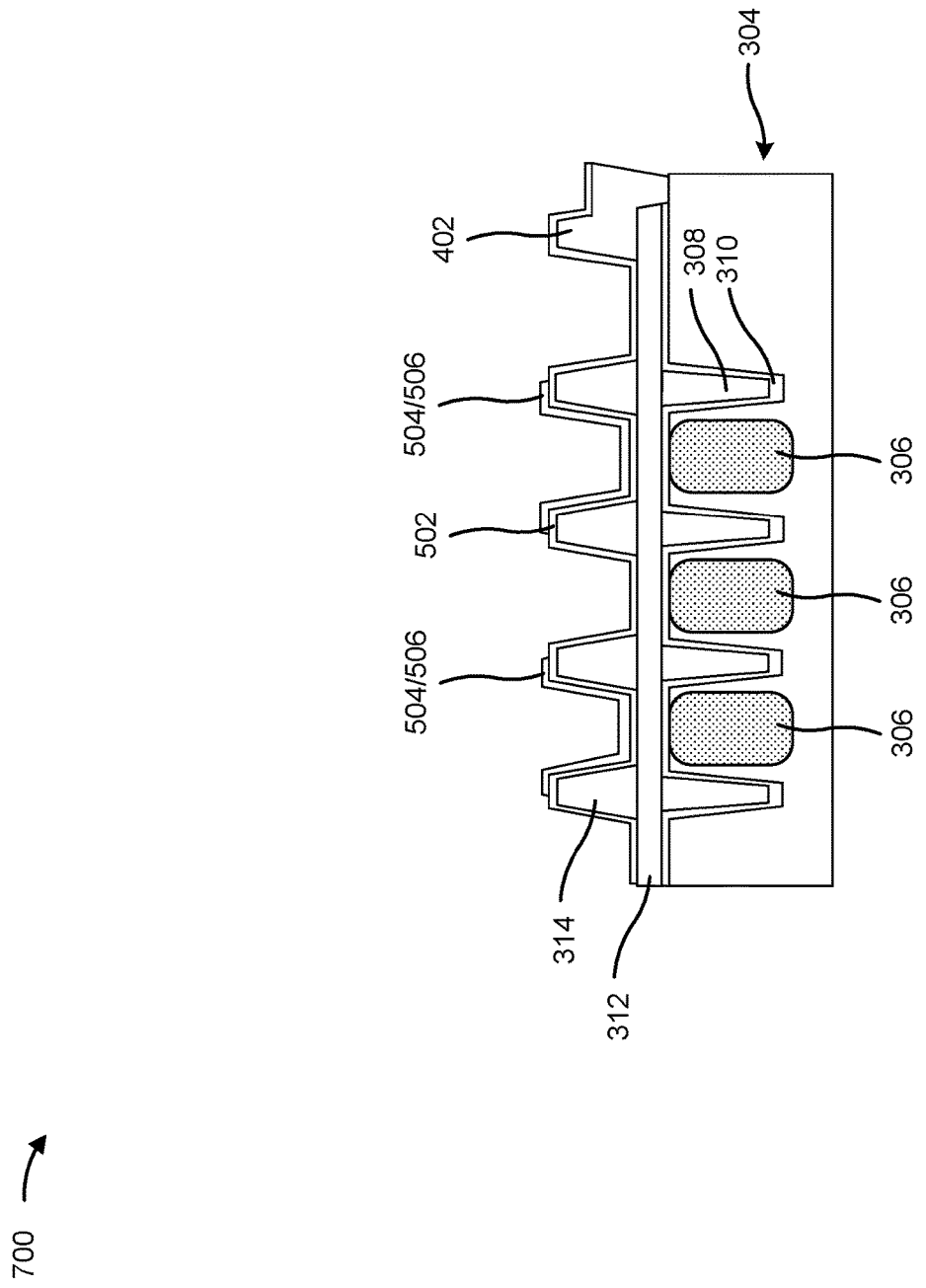

As shown in FIG. 7E, portions of the blocking layer over photodiodes 306 of LPDs are etched. Accordingly, the etch tool 108 may etch a portion of the blocking layer formed over the photodiodes 306 of LPDs rather than photodiodes 306 of SPDs. For example, the etch tool 108 may use a wet etch technique, a dry etch technique, a plasma-enhanced etch technique, and/or another type of etch technique to etch the portion of the blocking layer. A photoresist removal tool may remove the remaining portions of the photoresist layer 702 (e.g., using a chemical stripper, a plasma asher, and/or another technique) after the etch tool 108 etches the blocking layer.

Figure 7F:
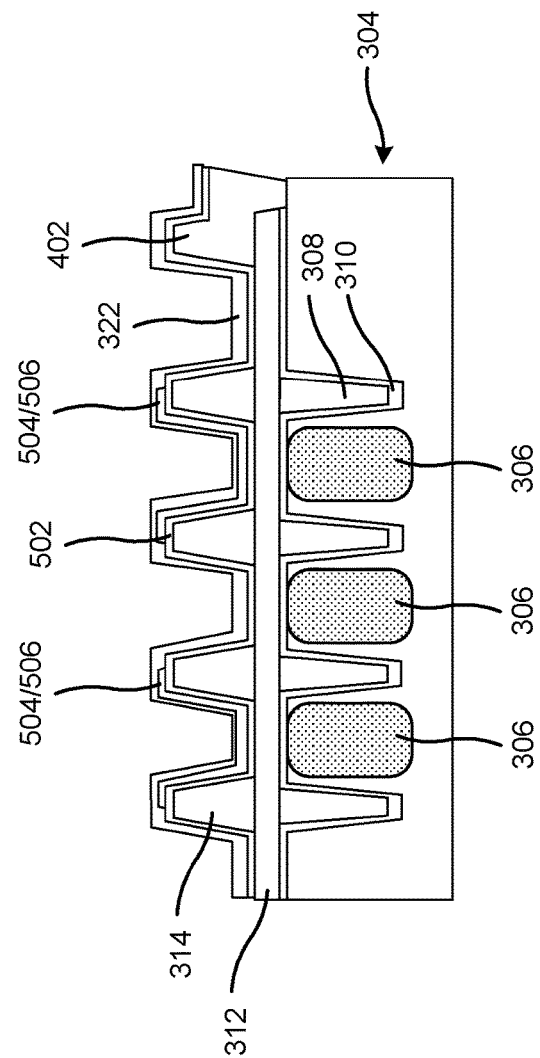

As shown in FIG. 7F, an isolation layer 322 may be formed over the photodiodes 306 and the isolation structure 308. For example, the deposition tool 102 may form the isolation layer 322 over and/or on the frontside surface of the substrate 304 (e.g., over the bottom electrode 502 and the blocking layer). In some implementations, the deposition tool 102 may form the isolation layer 322 using a spin-coating technique, a CVD technique, a PVD technique, an ALD technique, and/or another deposition technique.

Figure 7G:
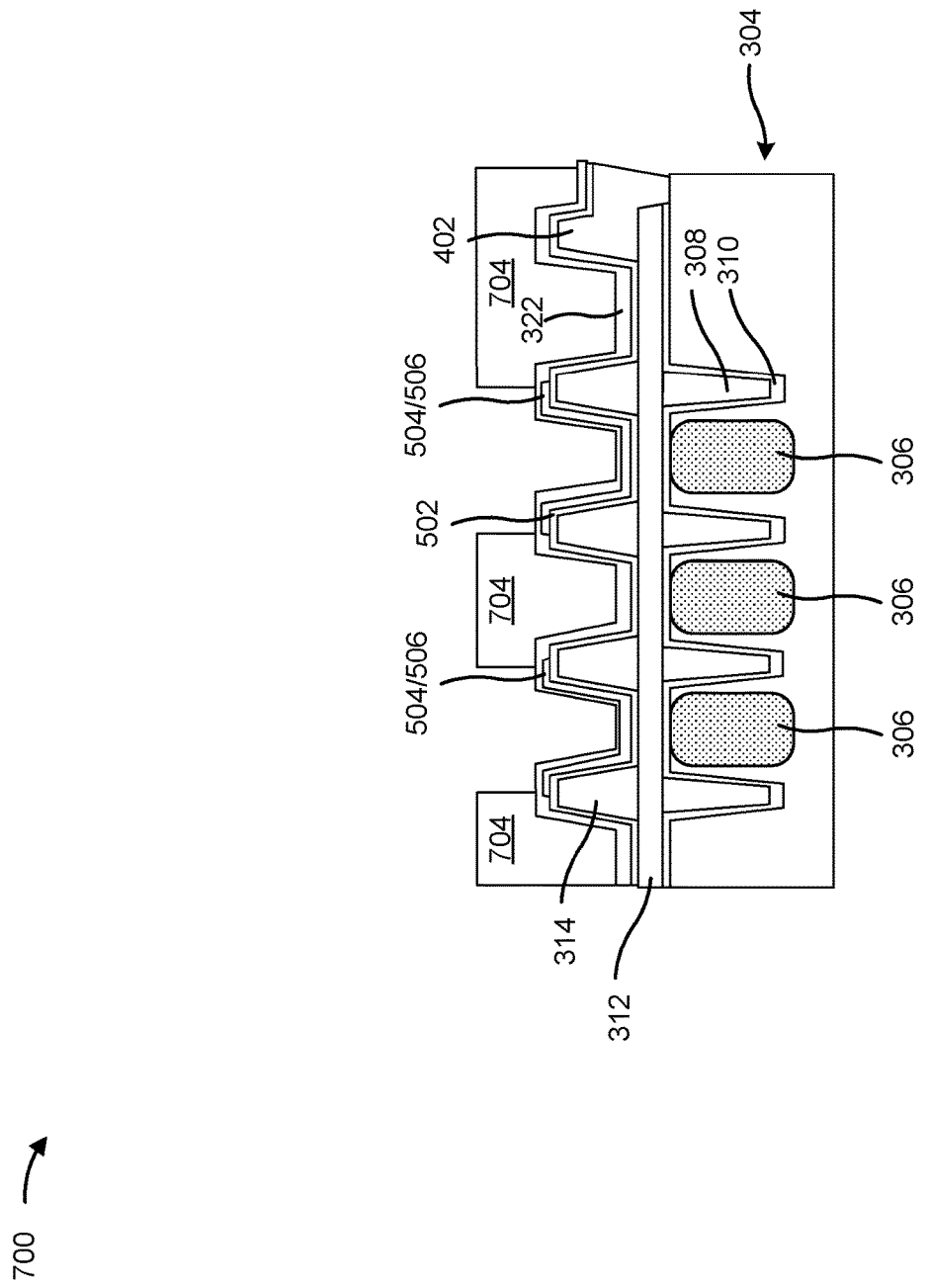

As shown in FIG. 7G, one or more masking layers (e.g., a photoresist layer 704 in example implementation 700) may be formed over the isolation layer 322. For example, the deposition tool 102 may form the photoresist layer 704 over and/or on the frontside surface of the substrate 304 (e.g., over the isolation layer 322). In some implementations, the deposition tool 102 may form the photoresist layer 704 using a spin-coating technique, a CVD technique, a PVD technique, an ALD technique, and/or another deposition technique. In some implementations, the photoresist layer 704 may be formed over the entire isolation layer 322. Accordingly, the exposure tool 104 may expose the photoresist layer 704 to a radiation source to form a pattern on the photoresist layer 704, and the developer tool 106 may develop and remove portions of the photoresist layer 704 to expose the pattern. As shown in FIG. 7G, the pattern may be such that the photoresist layer 704 is over portions of the isolation layer 322 that are adjacent to, rather than over, the blocking layer.

Figure 7H:
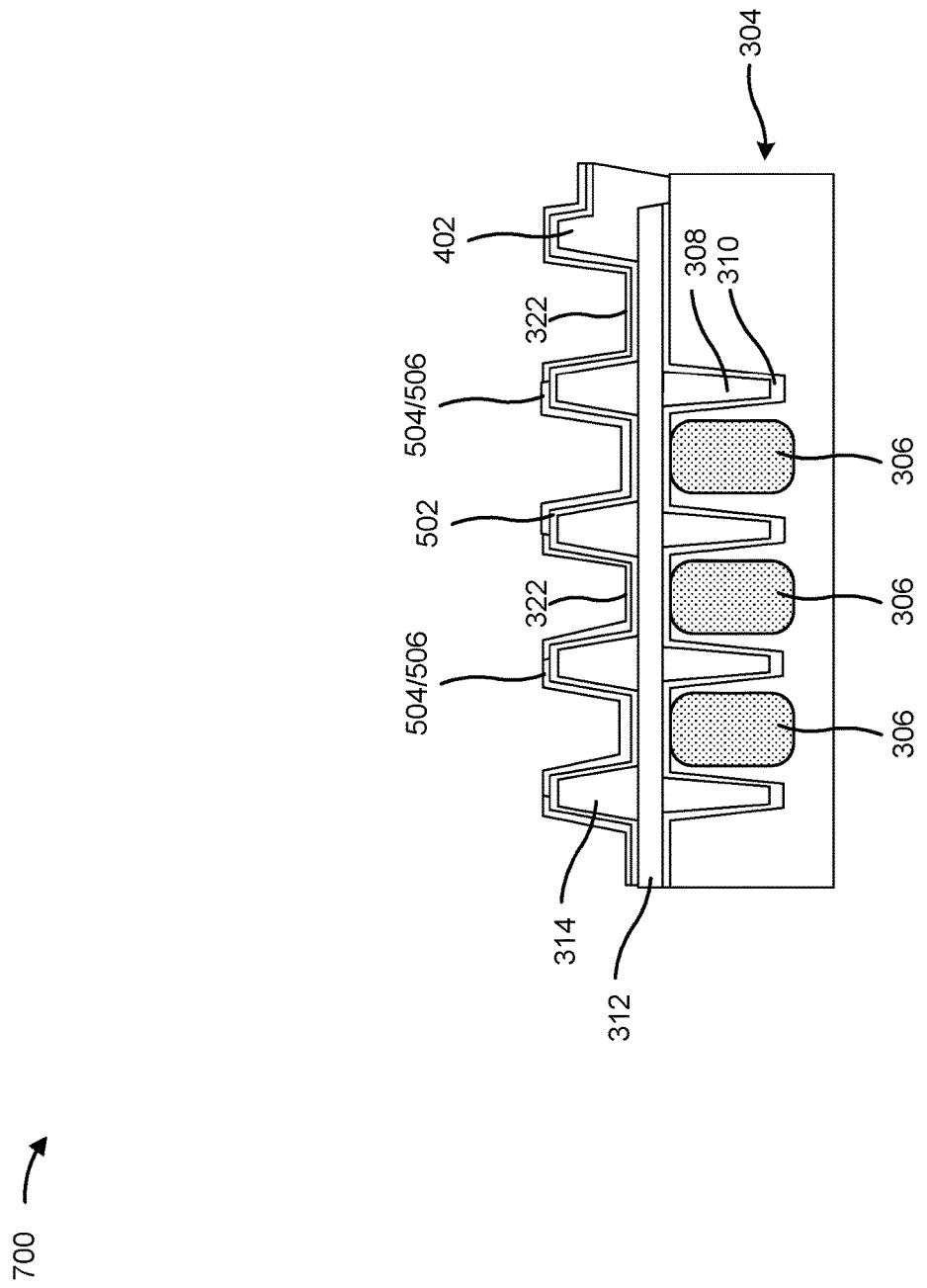

As shown in FIG. 7H, portions of the isolation layer 322 over the blocking layer are etched. Accordingly, the etch tool 108 may etch a portion of the isolation layer 322 formed over the blocking layer rather than the bottom electrode 502. For example, the etch tool 108 may use a wet etch technique, a dry etch technique, a plasma-enhanced etch technique, and/or another type of etch technique to etch the portion of the isolation layer 322. A photoresist removal tool may remove the remaining portions of the photoresist layer 704 (e.g., using a chemical stripper, a plasma asher, and/or another technique) after the etch tool 108 etches the isolation layer 322.

Figure 7I:
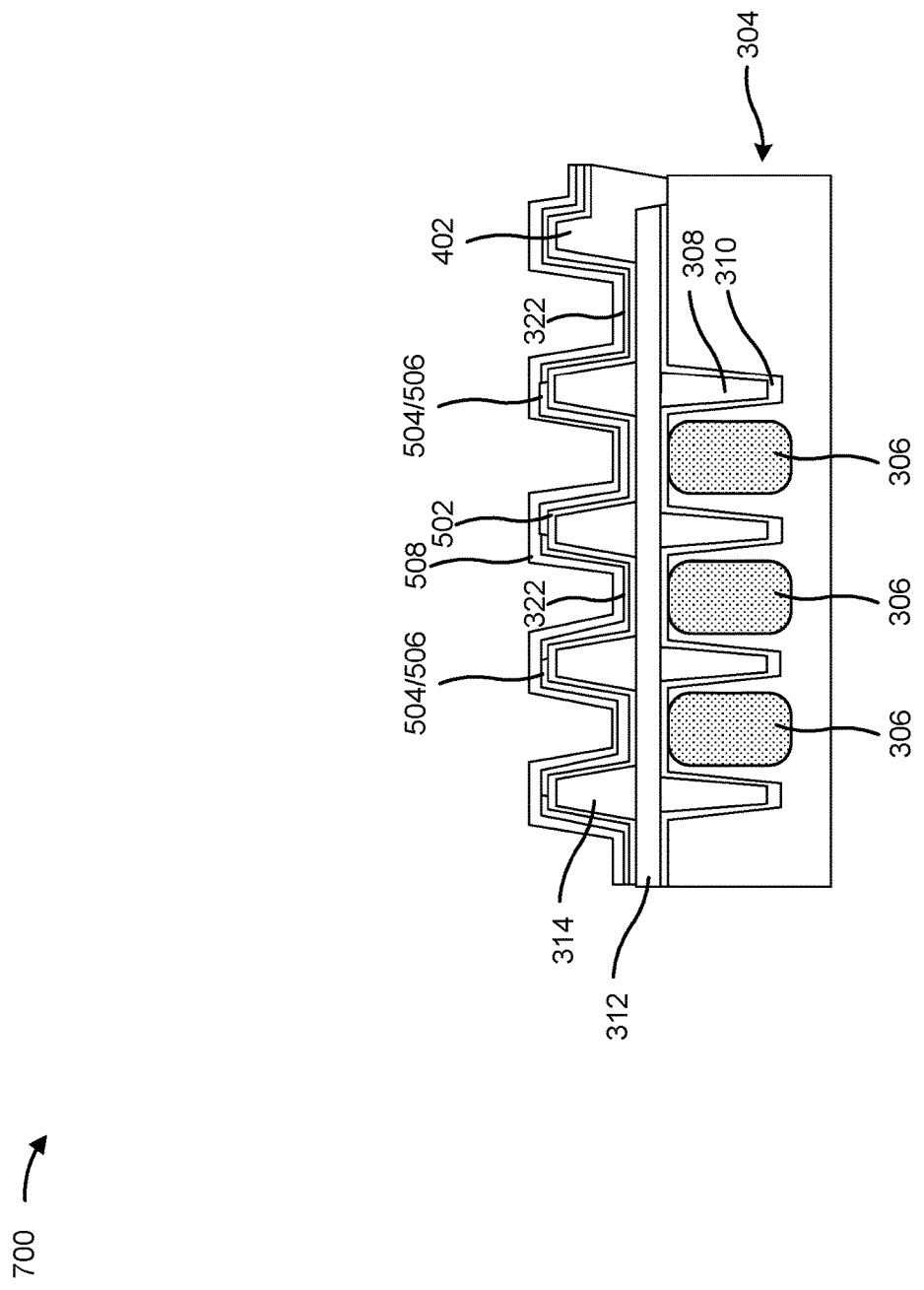

As shown in FIG. 7I, a top electrode 508 may be formed over the blocking layer and the isolation layer 322. For example, the deposition tool 102 may form the top electrode 508 over and/or on the frontside surface of the substrate 304 (e.g., over the isolation layer 322 and the blocking layer). In some implementations, the deposition tool 102 may form the top electrode 508 using a spin-coating technique, a CVD technique, a PVD technique, an ALD technique, and/or another deposition technique. Some implementations, however, may omit the top electrode 508, as described in connection with FIG. 6A.

As indicated above, FIGS. 7A-7I are provided as an example. Other examples may differ from what is described with regard to FIGS. 7A-7I.

FIG. 8 is a diagram of example components of a device 800 described herein. In some implementations, one or more of the semiconductor processing tools 102-116 and/or the wafer/die transport tool 118 may include one or more devices 800 and/or one or more components of device 800. As shown in FIG. 8, device 800 may include a bus 810, a processor 820, a memory 830, an input component 840, an output component 850, and a communication component 860.

Bus 810 may include one or more components that enable wired and/or wireless communication among the components of device 800. Bus 810 may couple together two or more components of FIG. 8, such as via operative coupling, communicative coupling, electronic coupling, and/or electric coupling. Processor 820 may include a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 may include one or more processors capable of being programmed to perform one or more operations or processes described elsewhere herein.

Memory 830 may include volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory 830 may be a non-transitory computer-readable medium. Memory 830 stores information, instructions, and/or software (e.g., one or more software applications) related to the operation of device 800. In some implementations, memory 830 may include one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry is used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
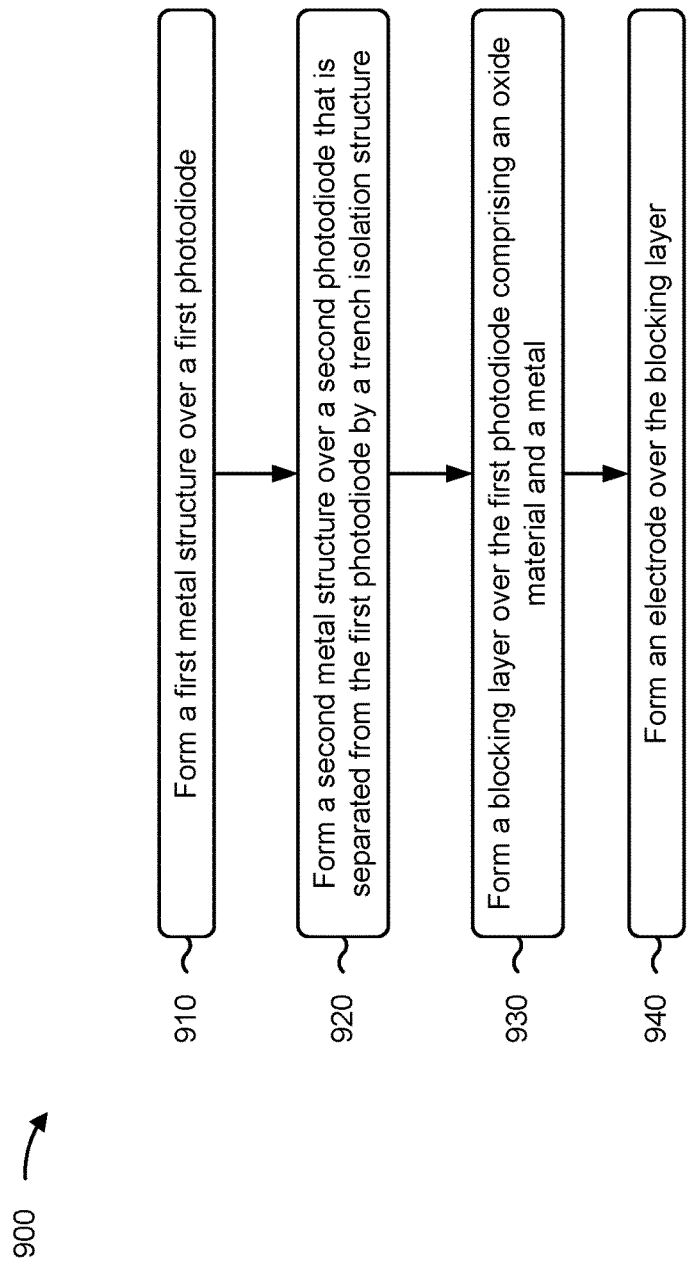
FIG. 9 is a flowchart of an example process associated with forming a semiconductor structure.

FIG. 9 is a flowchart of an example process 900 associated with forming pixel sensors. In some implementations, one or more process blocks of FIG. 9 are performed by one or more semiconductor processing tools (e.g., one or more of the semiconductor processing tools 102-116). Additionally, or alternatively, one or more process blocks of FIG. 9 may be performed by one or more components of device 800, such as processor 820, memory 830, input component 840, output component 850, and/or communication component 860.

As shown in FIG. 9, process 900 may include forming a first metal structure over a first photodiode (block 910). For example, one or more of the semiconductor processing tools 102-116 may form a first metal structure 314 over a first photodiode 306, as described herein.

As further shown in FIG. 9, process 900 may include forming a second metal structure over a second photodiode that is separated from the first photodiode by a trench isolation structure (block 920). For example, one or more of the semiconductor processing tools 102-116 may form a second metal structure 314 over a second photodiode 306 that is separated from the first photodiode 306 by a trench isolation structure 308, as described herein.

As further shown in FIG. 9, process 900 may include forming a blocking layer over the first photodiode comprising an oxide material and a metal (block 930). For example, one or more of the semiconductor processing tools 102-116 may form a blocking layer, over the first photodiode 306, comprising an oxide material 504 and a metal 506, as described herein.

As further shown in FIG. 9, process 900 may include forming an electrode over the blocking layer (block 940). For example, one or more of the semiconductor processing tools 102-116 may form an electrode 508 over the blocking layer, as described herein.

Process 900 may include additional implementations, such as any single implementation or any combination of implementations described below and/or in connection with one or more other processes described elsewhere herein.

In a first implementation, process 900 includes forming an additional electrode 502 over the first metal structure 314 and the second metal structure 314 and under the blocking layer.

In a second implementation, alone or in combination with the first implementation, the blocking layer is formed by forming the oxide material 504 and the metal 506 over the first metal structure 314 and the second metal structure 314 and by etching a portion of the oxide material 504 and a portion of the metal 506 outside of an area between the first metal structure 314 and the second metal structure 314.

In a third implementation, alone or in combination with one or more of the first and second implementations, process 900 includes forming an isolation layer 322 over, and adjacent to, the blocking layer.

In a fourth implementation, alone or in combination with one or more of the first through third implementations, process 900 includes etching a portion of the isolation layer 322 over the blocking layer.

In a fifth implementation, alone or in combination with one or more of the first through fourth implementations, the first photodiode 306 is included in a SPD, and the second photodiode 306 is included in a LPD.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

In this way, an electrode controls transmittance of a blocking layer over a photodiode of a pixel sensor (e.g., a photodiode of an SPD) by changing oxidation of a metal material included in the blocking layer. By using the electrode to adjust transmittance of the blocking layer, pixel sensors for different uses and/or products may be produced using a single manufacturing process. As a result, power and processing resources are conserved that otherwise would have been expended in switching manufacturing processes. Additionally, production time is decreased (e.g., by eliminating downtime that would otherwise have been used to reconfigure fabrication machines).

As described in greater detail above, some implementations described herein provide a device. The device includes a first photodiode and a second photodiode that is separated from the first photodiode by a trench isolation structure. The device includes a blocking layer over the first photodiode comprising an oxide material and a metal. The device includes at least one electrode configured to cause a voltage differential across the blocking layer.

As described in greater detail above, some implementations described herein provide a method. The method includes forming a first metal structure over a first photodiode. The method includes forming a second metal structure over a second photodiode that is separated from the first photodiode by a trench isolation structure. The method includes forming a blocking layer over the first photodiode comprising an oxide material and a metal. The method includes forming an electrode over the blocking layer.

As described in greater detail above, some implementations described herein provide a device. The device includes a first photodiode and a second photodiode separated from the first photodiode by a trench isolation structure. The device includes a blocking layer, over the first photodiode, comprising a liquid crystal. The device includes at least one electrode configured to cause a voltage differential across the blocking layer.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a small pixel detector (SPD) comprising:
   a first photodiode,
   a blocking layer over the first photodiode comprising an oxide material and a metal, and
   an electrode formed directly on the blocking layer and configured to cause a voltage differential across the blocking layer; and
   a large pixel detector (LPD) comprising:
   a second photodiode that is separated from the first photodiode by a trench isolation structure,
   a passivation layer over the second photodiode, and
   the electrode formed directly on the passivation layer.

2. The device of claim 1, wherein the electrode is transparent electrode.

3. The device of claim 1, further comprising:
   an isolation layer adjacent to the blocking layer.

4. The device of claim 1, further comprising another electrode under the blocking layer.

5. The device of claim 1, wherein the oxide material comprises zirconium oxide or hafnium oxide,
   wherein the metal comprises titanium, tungsten, molybdenum, or niobium, and
   wherein the electrode is an indium tin oxide (ITO) electrode.

6. A method, comprising:
   forming a first metal structure over a first photodiode;
   forming a second metal structure over a second photodiode that is separated from the first photodiode by a trench isolation structure;
   forming a blocking layer over the first photodiode, the blocking layer comprising an oxide material and a metal;
   forming a passivation layer over the second photodiode; and
   forming an electrode directly on the blocking layer and directly on the passivation layer.

7. The method of claim 6, further comprising:
   forming an additional electrode over the first metal structure and the second metal structure and under the blocking layer.

8. The method of claim 6, wherein forming the blocking layer comprises:
   forming the oxide material and the metal over the first metal structure and the second metal structure; and
   etching a portion of the oxide material and a portion of the metal outside of an area between the first metal structure and the second metal structure.

9. The method of claim 6, further comprising:
   forming an isolation layer over, and adjacent to, the blocking layer.

10. The method of claim 9, further comprising:
    etching a portion of the isolation layer over the blocking layer.

11. The method of claim 6, wherein the first photodiode is included in a small pixel detector (SPD), and the second photodiode is included in a large pixel detector (LPD).

12. A device, comprising:
    a small pixel detector (SPD) comprising:
    a first photodiode,
    a blocking layer, over the first photodiode, comprising a liquid crystal, and
    a portion of an electrode formed directly on the blocking layer and configured to cause a voltage differential across the blocking layer; and
    a large pixel detector (LPD) comprising:
    a second photodiode separated from the first photodiode by a trench isolation structure,
    a passivation layer over the second photodiode, and
    another portion of the electrode formed directly on the passivation layer.

13. The device of claim 12, wherein the electrode is a transparent electrode.

14. The device of claim 12, further comprising:
    an isolation layer adjacent to the blocking layer.

15. The device of claim 12, further comprising another electrode under the blocking layer.

16. The device of claim 15, wherein the other electrode is floating.

17. The device of claim 12, wherein the liquid crystal comprises a polymer-dispersed liquid crystal (PDLC).

18. The device of claim 1, further comprising:
a metal layer between the SPD and the LPD.

19. The device of claim 18, wherein a portion of the blocking layer, between the SPD and the LPD, is formed directly on the metal layer.

20. The device of claim 1, further comprising:
a grounding node.

* * * * *